(12) United States Patent
Roth et al.

(10) Patent No.: US 11,081,414 B2
(45) Date of Patent: Aug. 3, 2021

(54) POWER SEMICONDUCTOR MODULE ARRANGEMENT

(71) Applicant: Infineon Technologies AG, Neubiberg (DE)

(72) Inventors: Alexander Roth, Zeitlarn (DE); Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/260,834

(22) Filed: Jan. 29, 2019

(65) Prior Publication Data
US 2019/0237372 A1    Aug. 1, 2019

(30) Foreign Application Priority Data

Jan. 30, 2018  (EP) ...................................... 18154008

(51) Int. Cl.
*H01L 23/24*    (2006.01)
*H01L 23/053*   (2006.01)
(Continued)

(52) U.S. Cl.
CPC .............. *H01L 23/24* (2013.01); *H01L 21/56* (2013.01); *H01L 23/053* (2013.01);
(Continued)

(58) Field of Classification Search
CPC ................................................ H01L 2224/291
See application file for complete search history.

(56) References Cited

U.S. PATENT DOCUMENTS

| 6,483,128 B2 | 11/2002 | Loddenkotter et al. |
| 10,283,447 B1 * | 5/2019 | Groening ............. H01L 25/072 |

(Continued)

FOREIGN PATENT DOCUMENTS

| DE | 102010008618 A1 | 9/2010 |
| EP | 0575889 A2 | 12/1993 |

(Continued)

OTHER PUBLICATIONS

"Information about Dow Corning® Brand Silicone Encapsulants", Dow Corning Product Information Sheet, pp. 1-6.
(Continued)

*Primary Examiner* — Thao P Le
(74) *Attorney, Agent, or Firm* — Murphy, Bilak & Homiller, PLLC (57) ABSTRACT

A power semiconductor module arrangement includes a substrate arranged in a housing. The substrate includes a first metallization layer arranged on a first side of a dielectric insulation layer and a second metallization layer arranged on a second side of the dielectric insulation layer. At least one semiconductor body is mounted on a first surface of the first metallization layer facing away from the dielectric insulation layer. A connecting element is arranged on and electrically connected to the first surface. A contact element is inserted into and electrically connected to the connecting element, and extends from the connecting element through an interior of the housing and through an opening in the cover of the housing to an outside of the housing in a direction perpendicular to the first surface. A hard encapsulation is arranged adjacent to the first metallization layer and at least partly fills the inside of the housing.

16 Claims, 5 Drawing Sheets

(51) Int. Cl.
*H01L 21/56* (2006.01)
*H01L 23/29* (2006.01)
*H01L 21/54* (2006.01)
*H01L 23/00* (2006.01)

(52) U.S. Cl.
CPC ............ *H01L 23/295* (2013.01); *H01L 21/54* (2013.01); *H01L 23/562* (2013.01); *H01L 24/29* (2013.01); *H01L 24/32* (2013.01); *H01L 2224/291* (2013.01); *H01L 2224/29139* (2013.01); *H01L 2224/32225* (2013.01); *H01L 2224/8384* (2013.01); *H01L 2224/83851* (2013.01); *H01L 2924/13055* (2013.01); *H01L 2924/13062* (2013.01); *H01L 2924/13064* (2013.01); *H01L 2924/13091* (2013.01); *H01L 2924/16151* (2013.01); *H01L 2924/16251* (2013.01); *H01L 2924/1815* (2013.01)

(56) References Cited

U.S. PATENT DOCUMENTS

| | | | | |
|---|---|---|---|---|
| 2010/0013085 A1* | 1/2010 | Oi | ........................ | H01L 25/072 257/396 |
| 2014/0029210 A1* | 1/2014 | Gowda | ............ | H01L 23/49833 361/746 |
| 2014/0268625 A1* | 9/2014 | Sherrer | ............... | H01L 23/3135 361/818 |
| 2015/0001700 A1* | 1/2015 | Hartung | .................. | H01L 23/24 257/698 |
| 2015/0303173 A1* | 10/2015 | Maydar | ............ | H01L 23/49827 257/664 |
| 2016/0380366 A1* | 12/2016 | Onishi | .................. | H01L 29/861 257/698 |

FOREIGN PATENT DOCUMENTS

| | | |
|---|---|---|
| EP | 0962974 A2 | 12/1999 |
| JP | 2002241581 A | 8/2002 |
| JP | 2003068979 A | 3/2003 |
| JP | 2008124176 A | 5/2008 |
| JP | 2010283107 A | 12/2010 |
| JP | 2014187179 A | 10/2014 |
| JP | 2014216558 A | 11/2014 |
| JP | 2015185561 A | 10/2015 |
| JP | 2016504765 A | 2/2016 |

OTHER PUBLICATIONS

"SYLGARD™ 182 Silicone Elastomer", Dow Technical Data Sheet, 2018, pp. 1-5.

* cited by examiner

POWER SEMICONDUCTOR MODULE ARRANGEMENT

TECHNICAL FIELD

The instant disclosure relates to a power semiconductor module arrangement and to a method for producing a power semiconductor module arrangement.

BACKGROUND

Power semiconductor module arrangements often include a substrate in a housing. The substrate usually comprises a substrate layer (e.g., a ceramic layer), a first metallization layer deposited on a first side of the substrate layer and a second metallization layer deposited on a second side of the substrate layer. A semiconductor arrangement including one or more controllable semiconductor elements (e.g., two IGBTs in a half-bridge configuration) may be arranged on a substrate. One or more contact elements, which allow contacting such a semiconductor arrangement from outside the housing, are usually provided. Power semiconductor modules are known where the contact elements are arranged on the substrate and protrude in a direction that is essentially perpendicular to the main surface of the substrate through a cover of the housing. The section of the contact elements which protrudes out of the housing may be mechanically and electrically coupled to a printed circuit board. Usually, the printed circuit board comprises openings and the contact elements are inserted through the respective openings. Often the power semiconductor module with the semiconductor arrangement including the contact elements is prefabricated and a customer may mount his own customized printed circuit board on the prefabricated power semiconductor module. Due to tolerances which occur when mounting the contact elements on the substrate as well as tolerances which occur during fabrication of the printed circuit board and the respective openings, the contact elements and the openings may not be accurately aligned. Therefore, when mounting a printed circuit board to the power semiconductor module, great forces may be exerted on the contact elements. Over time, this may lead to damage to the power semiconductor module.

There is a need for a power semiconductor module arrangement that provides an increased mechanical robustness to prevent damage, and a method for producing the same.

SUMMARY

A power semiconductor module arrangement includes a housing comprising sidewalls and a cover, and a substrate arranged in the housing, the substrate comprising a dielectric insulation layer, a first metallization layer arranged on a first side of the dielectric insulation layer, and a second metallization layer arranged on a second side of the dielectric insulation layer, wherein the dielectric insulation layer is disposed between the first and the second metallization layer. The power semiconductor module arrangement further includes at least one semiconductor body mounted on a first surface of the first metallization layer which faces away from the dielectric insulation layer, a connecting element arranged on and electrically connected to the first surface of the first metallization layer, a contact element that is inserted into and electrically connected to the connecting element, wherein the contact element extends from the connecting element through the interior of the housing and through an opening in the cover of the housing to the outside of the housing in a direction perpendicular to the first surface, and a hard encapsulation that is arranged adjacent to the first metallization layer and that at least partly fills the inside of the housing.

A power semiconductor module arrangement includes a substrate, at least one semiconductor body, a connecting element and a contact element, wherein the substrate comprises a dielectric insulation layer, a first metallization layer arranged on a first side of the dielectric insulation layer, and a second metallization layer arranged on a second side of the dielectric insulation layer, wherein the dielectric insulation layer is disposed between the first and the second metallization layer, and wherein the at least one semiconductor body is mounted on a first surface of the first metallization layer which faces away from the dielectric insulation layer. The connecting element is arranged on and electrically connected to the first surface of the first metallization layer, and the contact element is inserted into and electrically connected to the connecting element. A method for producing such a power semiconductor module arrangement includes arranging the substrate in a housing, wherein the housing comprises walls, at least partly filling a capacity formed by the walls of the housing and the substrate with an encapsulation material, hardening the encapsulation material to form a hard encapsulation, and closing the housing, wherein the contact element extends from the connecting element through the interior of the housing and through an opening in the cover of the housing to the outside of the housing in a direction perpendicular to the first surface.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or may be included in a semiconductor chip. A semiconductor body has electrically connecting pads and includes at least one semiconductor element with electrodes.

Figure 1:
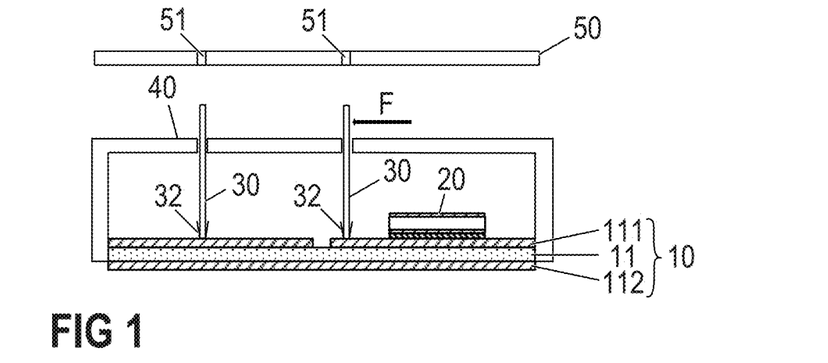
FIG. 1 is a cross-sectional view of a conventional power semiconductor module arrangement.

Referring to FIG. 1, a conventional power semiconductor module arrangement is illustrated. The power semiconductor module arrangement includes a substrate 10. The substrate 10 includes a dielectric insulation layer 11, a (structured) first metallization layer 111 arranged on a first side of the dielectric insulation layer 11, and a second metallization layer 212 arranged on a second side of the dielectric insulation layer 11. The dielectric insulation layer 11 is disposed between the first and the second metallization layer 111, 112.

Each of the first and second metallization layers 111, 112 may consist of or include one of the following materials: copper; a copper alloy; aluminium; an aluminium alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminium oxide; aluminium nitride; zirconium oxide; silicon nitride; boron nitride; or any other dielectric ceramic. The substrate 10 may be, e.g., a Direct Copper Bonding (DCB) substrate, a Direct Aluminium Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, or BrN and may have a diameter of between about 1 μm and about 50 μm. The substrate 10, however, may also be a conventional printed circuit board (PCB) having a non-ceramic dielectric insulation layer 11. For instance, a non-ceramic dielectric insulation layer 11 may consist of or include a cured resin.

One or more semiconductor bodies 20 may be arranged on the substrate 10. In particular, the one or more semiconductor bodies 20 may be arranged on a first surface of the first metallization layer 111 which faces away from the dielectric insulation layer 11. Each of the semiconductor bodies 20 arranged on the semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the substrate 10. In FIG. 1, only one semiconductor body 20 is exemplarily illustrated. The one or more semiconductor bodies 20 may be electrically and mechanically connected to the main substrate 10 by an electrically conductive connection layer (not illustrated in FIG. 1). Such an electrically conductive connection layer may be a solder layer, a layer of an electrically conductive adhesive, or a layer of a sintered metal powder (e.g., a sintered silver powder), for example.

The second metallization layer 112 of the semiconductor substrate 10 in FIG. 1 is a continuous layer. The first metallization layer 111 is a structured layer in the example illustrated in FIG. 1. "Structured layer" in this context means that the first metallization layer 111 is not a continuous layer, but includes recesses between different sections of the layer. Such a recess is schematically illustrated in FIG. 1. The first metallization layer 111 in this example includes two different sections. Different semiconductor bodies 20 may be mounted to the same or to different sections of the first metallization layer 111. There may also be sections of the first metallization layer 111 with no semiconductor bodies 20 mounted thereon. Different sections of the first metallization layer 111 may have no electrical connection or may be electrically connected to one or more other sections.

The substrate 10 may be arranged in a housing 40 to form a power semiconductor module. In order to facilitate an electrical connection of different sections of the first metallization layer 111 and the semiconductor bodies 20 and/or any other elements and components arranged on the first metallization layer 111 with each other as well as with external components outside the housing 40 (e.g., a printed circuit board), the power semiconductor module arrangement includes at least one contact element 30. The at least one contact element 30 is arranged on the substrate 10. Generally, the contact element 30 is arranged on the same surface (here: first surface of the first metallization layer 111) as the semiconductor bodies 20. The contact element 30 may be a pin or a wire, for example. The contact element 30 may consist of or include a metal or metal alloy. For example, the contact element 30 may consist of or include copper. The contact element 30 is connected to the substrate 10 by means of a connecting element 32. The connecting element 32 is arranged on the substrate 10, in particular on the first surface of the first metallization layer 111.

The connecting element 32 generally may include a solder layer, for example. For example, the contact element 30 may be directly soldered to the substrate 10. This, however, is only an example. As is illustrated in FIG. 1, the connecting element 32 may also include a sleeve or a rivet. The connecting element 32 may be soldered, welded or glued to the substrate 10, for example. The connecting element 32 is configured to attach and electrically connect the contact element 30 to the substrate 10. The connecting element 32 may comprise a tubular part (such as, e.g., a hollow bushing) that is configured to fit over and encompass a first end of the contact element 30. This means that a first end of the contact element 30 may be inserted into the connecting element 32.

The connecting element 32 and the first end of the contact element 30 may form a press-fit connection, for example. Therefore, the contact element 30 may include or may be a press-fit pin, for example. The connecting element 32 may include an appropriate counterpart for the press-fit pin. While not connected to the counterpart, a press-fit pin has a larger width than its counterpart. The width of the press-fit pin is a width in a direction parallel to an upper surface of the semiconductor substrate 10. An upper surface of the semiconductor substrate 10 is a surface on which the connecting element 32 is mounted (e.g., first surface of the first metallization layer 111). During the press-in process, the press-fit pin is pushed into the counterpart. This results in a plastic deformation of the press-fit pin. When inserted into the counterpart, the width of the press-fit pin is reduced. Only small insertion forces are generally necessary with high holding forces at the same time. The press-fit pin and the counterpart, after inserting the press-fit pin, are firmly attached to each other. The reduced width of the press-fit pin results in a force which counteracts the compression of the press-fit pin. The contact element 30, therefore, may not be easily detached from the connecting element 32. To further increase the anchoring of the contact element 30 in the connecting element 32 against forces in a direction perpendicular to the first surface of the first metallization layer 111 which pull the contact element 30 away from the substrate 10, the contact element 30 may have a rectangular, polygonal or other suitable cross-section instead of a simple rounded cross-section. Further, the contact element 30 may comprise flanges (not illustrated) at its first end that are configured to further secure the contact element 30 in the connecting element 32. Any other suitable connections between the contact element 30 and the connecting element 32 are possible.

The contact element 30 protrudes from the substrate 10 and from the connecting element 32 through the inside of the housing 40 and through an opening in the cover of the housing 40 such that a second end of the contact element 30 protrudes to the outside of the housing 40. In this way, the contact element 30 may be contacted from the outside of the housing 40.

For example, the second ends of the contact elements 30 may be connected to a printed circuit board 50. The printed circuit board 50 may comprise openings 51 and the contact elements 30 may be inserted into the openings 51 of the printed circuit board 50. The printed circuit board 50 may comprise conducting tracks (not illustrated) and a contact element 30 may be electrically coupled to one or more other contact elements 30 by means of one or more conducting tracks. In this way, an electrical connection may be provided between different sections of the first metallization layer 111, between different semiconductor bodies 20, and/or between any other components arranged on the substrate 10. The contact elements 30 may be soldered to the printed circuit board 50, for example, to provide for a permanent and solid connection.

The power semiconductor module arrangement usually is prefabricated. The printed circuit board 50, however, is generally customer-specific and is attached to the power semiconductor module arrangement at a later stage. A printed circuit board 50 needs to match the semiconductor arrangement and, in particular, the positions of the contact elements 30. In particular, the positions of the openings 51 of the printed circuit board 50 need to match the positions of the contact elements 30 such that the contact elements 30 may be easily inserted into the openings 51. However, there are usually certain tolerances when mounting the connecting elements 32 and the contact elements 30 to the substrate 10. Further, there are certain tolerances when forming the openings 51 in the printed circuit board 50. There may be even further tolerances when forming the openings in the cover of the housing 40 through which the contact elements 30 protrude. The tolerances may be in the range of up to several 100 μm, for example. This means, that the second ends of the contact elements 30 may not be accurately aligned with the openings in the housing 40 and even further, with the openings 51 in the printed circuit board. Therefore, the contact elements 30 are generally bendable to a certain degree such that they may still be inserted in the openings 51 even if they are slightly misaligned to the openings 51. Therefore, rather high forces F may be exerted to the contact elements 30 when bending the second ends of the contact elements 30 to fit into the openings 51 of the printed circuit board 50. This is exemplarily illustrated by means of a bold arrow in FIG. 1.

These forces F may influence the mechanical stability of the contact elements 30. For example, the electrical connections between the contact elements 30 and the connecting elements 32 or between the contact elements 30 and the printed circuit board 50 may have to withstand great forces and may be damaged over time. This may influence the operation of the power semiconductor module arrangement. The contact elements 30 are arranged at a certain distance from each other. For example, a distance between two neighboring contact elements 30 may be less than 5 cm in smaller packages. In bigger packages, the distance between two neighboring contact elements 30 may be 5 cm or more. Generally, the mechanical robustness of such an arrangement worsens, the bigger the dimensions of the power semiconductor module arrangement and the greater the distance between two neighboring contact elements 30.

The present invention aims at improving the mechanical robustness of such a power semiconductor module arrangement and may further increase the robustness of the power semiconductor module arrangement against lateral thermal cycles.

Figure 2:
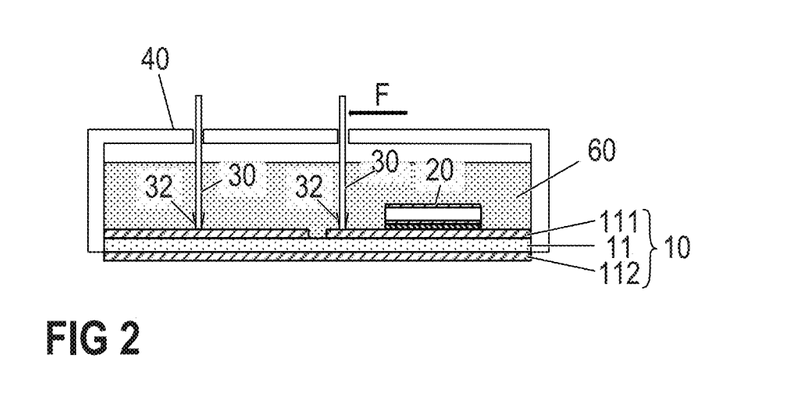
FIG. 2 is a cross-sectional view of an example of a power semiconductor module arrangement.

Referring to FIG. 2, the power semiconductor module arrangement generally corresponds to the arrangement as described with reference to FIG. 1 above. However, as is schematically illustrated in FIG. 2, the housing 40 is at least partly filled with a hard encapsulation 60. The hard encapsulation 60 is arranged adjacent to the substrate 10. This means that the hard encapsulation 60 covers those parts of the first metallization layer 111 that are not covered by the connecting elements 32, by the semiconductor bodies 20 or by any other components arranged on the first metallization layer 111. The hard encapsulation 60 may further cover the one or more semiconductor bodies 20 and the connecting elements 32 arranged on the substrate 10. The hard encapsulation 60 further at least partially encloses the contact elements 30.

The hard encapsulation 60 may include a hard resin. For example, the hard encapsulation 60 may have a hardness of at least 40 Shore A, at least 60 Shore A, or at least 50 Shore D. These, however, are only examples. The hard encapsulation 60 may have any hardness that allows the hard encapsulation 60 to provide sufficient mechanical stability of the contact elements 30 that are at least partly embedded in the hard encapsulation 60.

Figure 3:
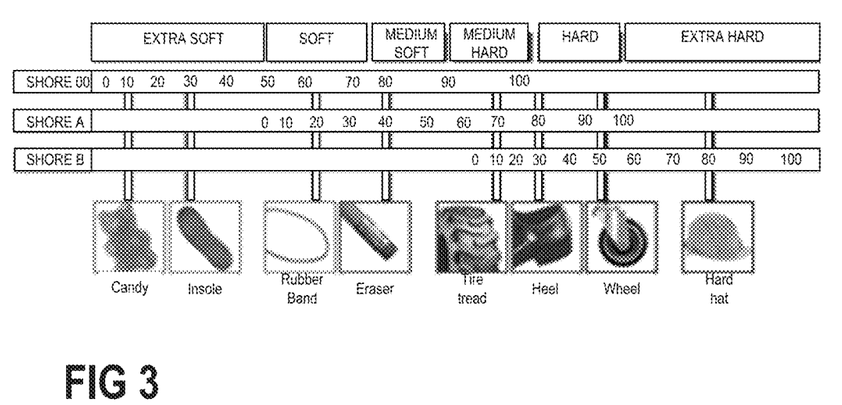
FIG. 3 schematically illustrates different shore hardness scales.

FIG. 3 exemplarily illustrates a Shore 00 scale, a Shore A scale and a Shore B scale as well as several examples of materials that have a certain hardness. The Shore 00 scale may be used to define materials that are less hard. The Shore 00 scale starts with materials that are extra soft such as "gummy" jelly candy, for example. The highest value of 100 Shore 00 refers to medium hard materials such as tire treads, for example. The Shore A scale is used for medium hard materials, starting at 0 Shore A for comparably soft materials. 20 Shore A refers to soft materials such as rubber bands, for example. The scale ends with a value of 100 Shore A which refers to comparably hard materials such as shopping cart wheels, for example. The Shore B scale is used for medium hard to extra hard materials. While a value of 10 Shore B refers to materials that are medium hard such as tire treads, for example, a value of 80 Shore B refers to materials which are extra hard such as hard hats, for example.

Figure 4:
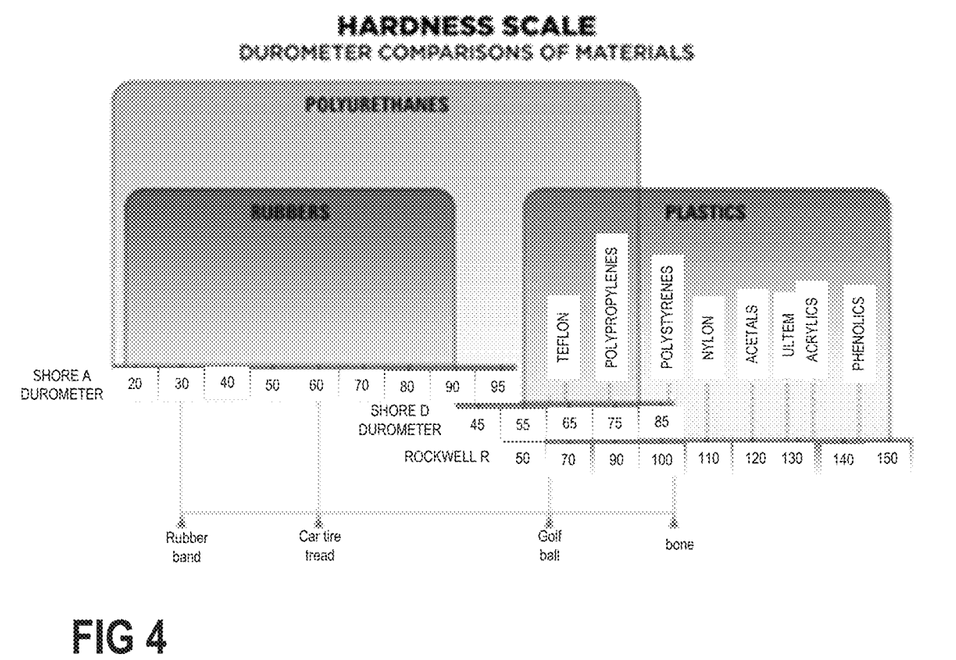
FIG. 4 schematically illustrates different shore hardness scales and a Rockwell scale.

Further examples of different scales are exemplarily illustrated in FIG. 4. FIG. 4 again exemplarily illustrates the Shore A scale which ranges from soft materials such as rubber bands to hard materials such as shopping cart wheels or golf balls, for example. The Shore A scale generally covers most rubbers and polyurethanes. FIG. 4 further illustrates a Shore D scale which overlaps with the Shore A scale to a certain degree. The Shore D scale partly covers rubbers and polyurethanes as well as part of the known plastics such as Teflon, polypropylenes and polystyrenes, for example. Most plastics, which are generally harder than rubbers and polyurethanes, are covered by the Rockwell R scale. The materials indicated in FIG. 4, however, are only examples.

The material that is used for the hard encapsulation 60 may be chosen from any materials that have a hardness that is suitable to provide a sufficient mechanical stability of the contact elements 30. For example, the hard encapsulation 60 may comprise a rubber or a polyurethane with a Shore A value of 40 or more, or with a Shore A value of 60 or more, for example. The hard encapsulation 60 may also include a polyurethane or a plastic with a Shore D value of 50 or more, for example. Generally, soft resins with a lower hardness cannot provide the required mechanical stability of the contact elements 30. The hard encapsulation 60 may also comprise any combination of suitable rubbers, polyurethanes, and plastics which is hard enough to provide sufficient stability.

In addition to the first material, the hard encapsulation 60 may further include a filler (not illustrated). For example, the filler may comprise particles that are evenly distributed within the first material of the hard encapsulation 60. The filler may comprise a ceramic material such as $Al_2O_3$ or $SiO_2$, for example. Alternatively, the filler may comprise inert porous plastic bodies, for example. The filler may further increase the mechanical stability of the hard encapsulation 60 and, therefore, of the power semiconductor module.

The hard encapsulation 60 may not only provide stability, but may further provide a barrier for corrosive gases, for example. The above-mentioned components, e.g., semiconductor bodies 20, connecting elements 32, solder layers, first metallization layer 111, as well as other components of the semiconductor arrangement inside the housing 40, may corrode when they come into contact with corrosive gases. Corrosive gases may include, e.g., sulfur or sulfur-containing compounds. Corrosive gases in the surrounding area of the power semiconductor module arrangement may penetrate into the inside of the housing 40. The housings that are used for power semiconductor module arrangements are usually not fully protected against protruding gases. Further, corrosive gases may enter the housing 40 when the housing 40 is opened for any reason or before the housing 40 is closed, for example. Inside the housing 40, the corrosive gases may form acids or solutions, for example, in combination with moisture that is present inside the housing 40. When corrosive gasses come into contact with moisture, they may form ions, e.g., alkali, earth alkali, or halogens. The corrosive gases or the resulting solutions or ions may cause a corrosion of some or all of the components inside the housing 40. During the corrosion process, the metallic constituents of the components may be oxidized to their respective sulfides. The sulfide formation may alter the electrical properties of the components or may result in the formation of new conductive connections and in short circuits within the power semiconductor module arrangement.

Examples for corrosive gases are hydrogen sulfide ($H_2S$), carbonyl sulfide (OCS), or gaseous sulfur (Ss). Generally, it is also possible that sulfur may enter the housing 40 as constituent of a solid material or liquid.

Components including one or more metals such as copper (e.g., first metallization layer 111, connecting element 32, contact element 30, chip pad metallization), silver (e.g., first metallization layer 111, connecting element 32, contact element 30, sintered layers, chip pad metallization), or lead (e.g. solder layers including leaded solder), may be particularly sensitive to corrosion. Other metals such as aluminium, for example, may have a thin oxide layer covering their surface area, which may provide at least a certain amount of protection against corrosive gases.

Figure 5:
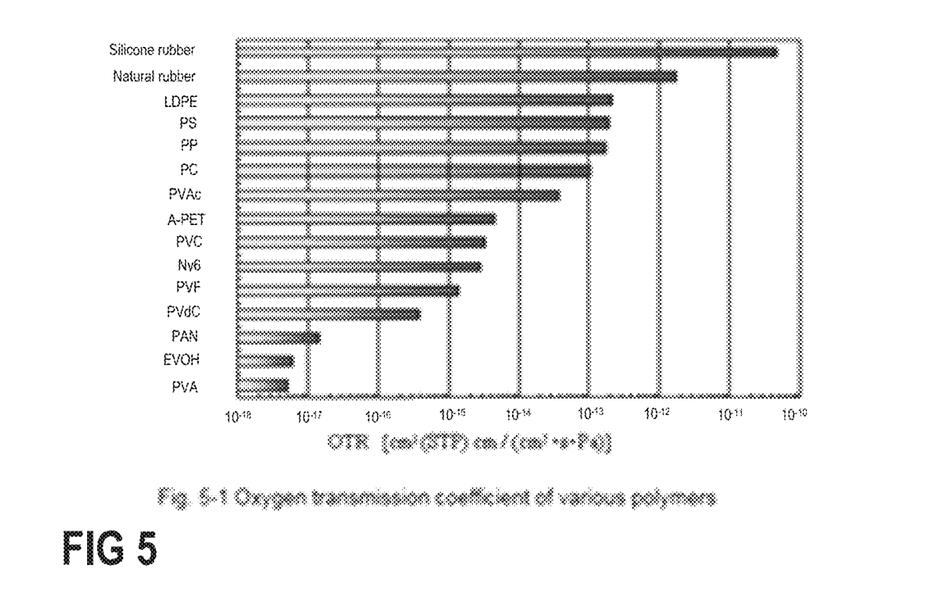
FIG. 5 schematically illustrates the oxygen transmission coefficients of various polymers.

FIG. 5 exemplarily illustrates the oxygen transmission coefficient of various polymers. The oxygen transmission coefficient or oxygen transmission rate (OTR) is the measurement of the amount of oxygen gas that passes through a substance or material over a given period. It is mostly determined for non-porous materials, where the mode of transport for oxygen is diffusion. The oxygen transmission coefficient is usually also indicative for the amount of corrosive gases that may enter the housing 40. A material that is less permeable for oxygen is usually also less permeable for other gases. The diagram illustrated in FIG. 5 shows the oxygen transmission coefficients for silicone rubber, natural rubber, low-density polyethylene (LDPE), polystyrene (PS), polypropylene (PP), polycarbonate (PC), polyvinyl acetate (PVAc), polyethylene terephthalate (A-PET), polyvinylchloride (PVC), Ny6, polyvinyl fluoride (PVF), polyvinylidene chloride (PVDC), polyacrylonitrile (PAN), ethylene vinyl alcohol (EVOH), and polyvinyl alcohol (PVA).

The material used for the hard encapsulation 60 may combine the advantages of a material having at least a certain hardness and a material providing a sufficient barrier for corrosive gasses. For example, the material of the hard encapsulation 60 may have an oxygen transmission coefficient of less than $10^{-10}$, or less than $10^{-12}$.

Figure 6A:
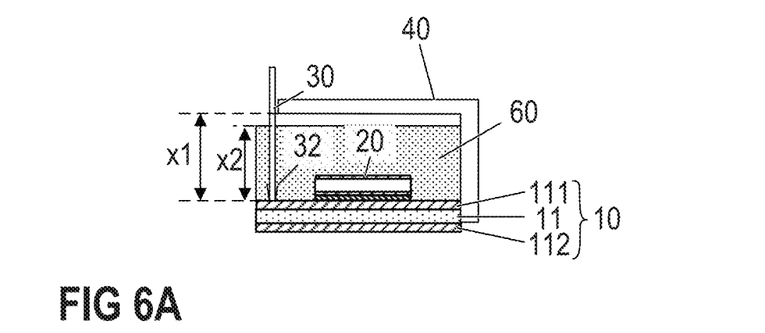
FIGS. 6A and 6B schematically illustrate sections of exemplary power semiconductor modules.

Referring to FIG. 6A, the hard encapsulation 60 may form a layer on the substrate 10. Any semiconductor bodies 20 or other components arranged on the substrate 10 may be arranged between the substrate 10 and the hard encapsulation 60. Between the substrate 10 and the cover of the housing 40, the contact elements 30 may have a first length x1, that is, in a direction perpendicular to the first surface of the first metallization layer 111. The total length of the contact elements 30 is greater than the first length x1, as part of the contact elements 30 protrudes out of the housing 40. The layer of hard encapsulation 60 may have a thickness x2 in a direction perpendicular to the first surface of the first metallization layer 111. The thickness x2 of the hard encapsulation 60 may be between 20% and 80% of the first length x1 of the contact elements 30. That is, the hard encapsulation 60 may cover 20-80% of the part of the contact elements 30 that is arranged inside the housing 40. This, however, is only an example. According to another example, the thickness x2 of the hard encapsulation 60 is between 40% and 60% of the first length x1 of the contact elements 30.

Figure 6B:
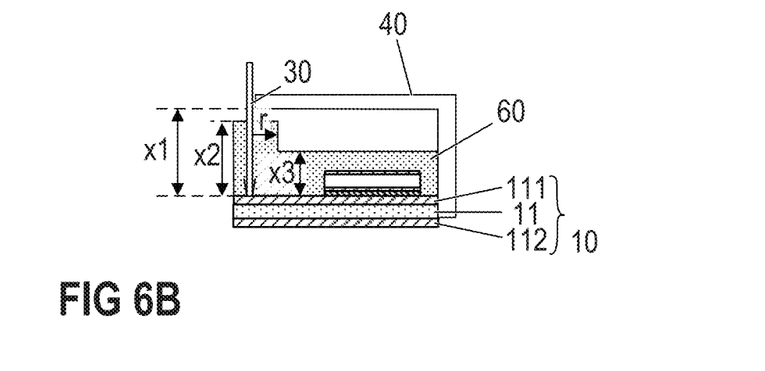

The hard encapsulation 60 may have an essentially even surface in a direction facing away from the substrate 10 and the semiconductor bodies 20. This is schematically illustrated in FIGS. 2 and 6A. As is schematically illustrated in FIG. 6B, it is also possible that the hard encapsulation 60 may have an uneven surface. For example, in an area surrounding a contact element 30, the hard encapsulation 60 may have a first thickness x2, as has been explained with reference to FIG. 6A above. In other areas, the hard encapsulation 60 may have a second thickness x3 which is less than the first thickness x2. For example, the hard encapsulation 60 may have the first thickness x2 in a first radius r around each of the contact elements 30. The first radius r may be up to 1 mm, up to 2 mm, up to 5 mm, or up to 1 cm, for example. In areas that are outside this radius r around the contact elements 30, the hard encapsulation 60 may have the second thickness x3 which is less than the first thickness x2.

In this way, less material is needed to form the hard encapsulation 60 and the mechanical stability of the contact elements 30 may still be provided. The second thickness x3 may be between 10% and 60%, or 20% to 40% of the first length x1 of the contact elements 30, for example. The second thickness x3, however, depends on a thickness of the semiconductor bodies 20 and any other components mounted on the substrate 10. The hard encapsulation 60 should at least completely cover any components mounted on the substrate 10.

Figure 7A:
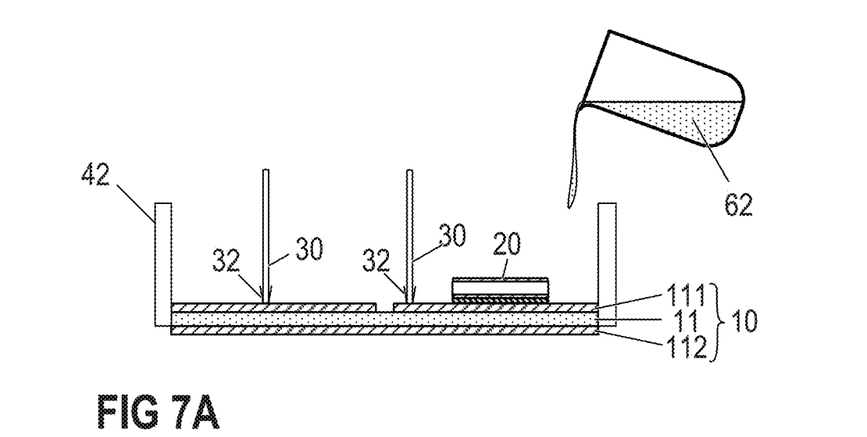
FIGS. 7A to 7C schematically illustrate an example of a method for producing a power semiconductor module.
Figure 7B:
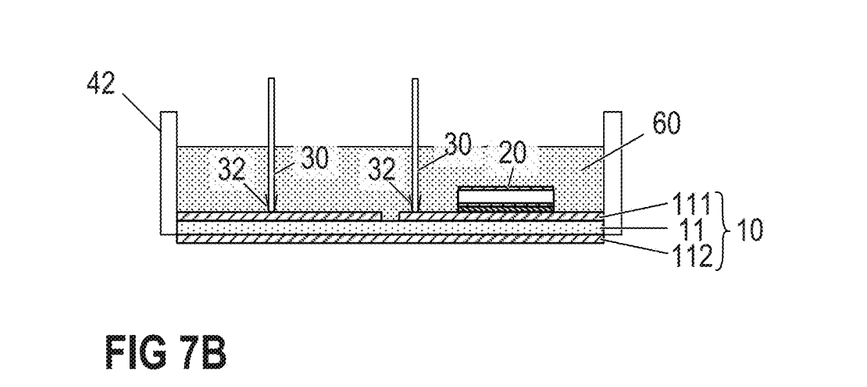
Figure 7C:
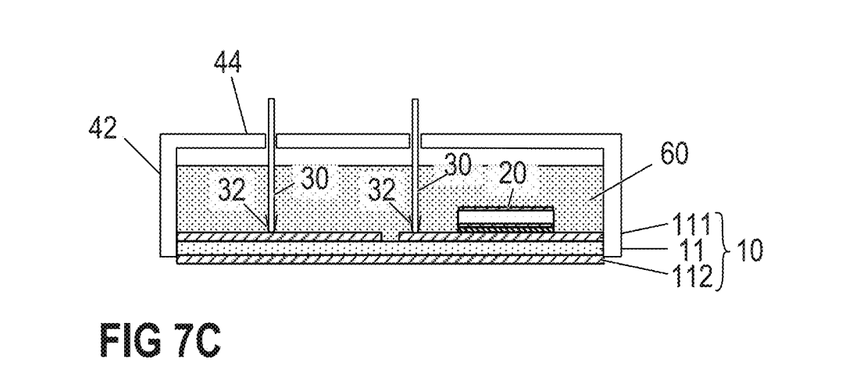

Referring to FIGS. 7A to 7C, an example of a method for producing a power semiconductor module arrangement is described. Referring to FIG. 7A, the housing may comprise walls 42. The substrate 10 with the semiconductor arrangement arranged thereon may be arranged within the walls 42 of the housing. As no cover is provided at this stage and the housing is open at the top, encapsulation material 62 may be filled into the capacity formed by the walls 42 and the substrate 10. The encapsulation material 62 may have a liquid, viscous or gel-like consistency. After filling the encapsulation material 62 into the housing, a hardening process may follow (FIG. 7B). During this hardening process, some or all of the liquid may be removed from the encapsulation material 62. Thereby, the encapsulation material 62 is hardened and forms the hard encapsulation 60. In a following step, which is schematically illustrated in FIG. 7C, the housing may be closed with a cover 44. The cover 44 may comprise openings, as has been described above, through which the contact elements 30 protrude.

Figure 8A:
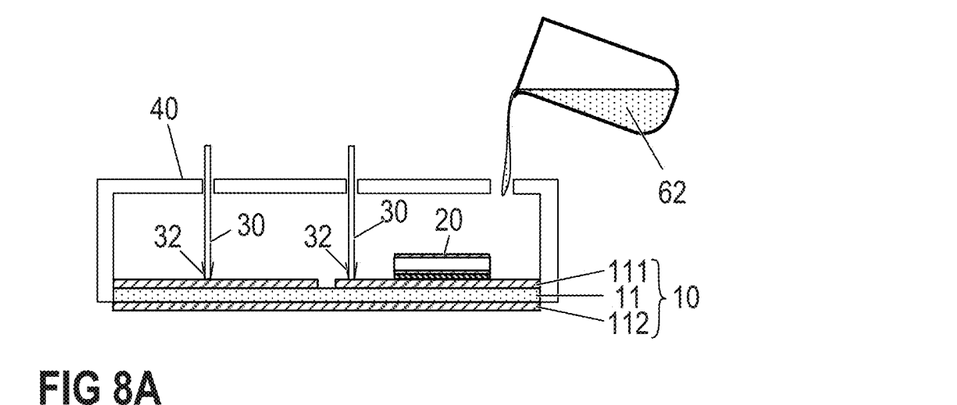
FIGS. 8A to 8C schematically illustrate another example of a method for producing a power semiconductor module.
Figure 8B:
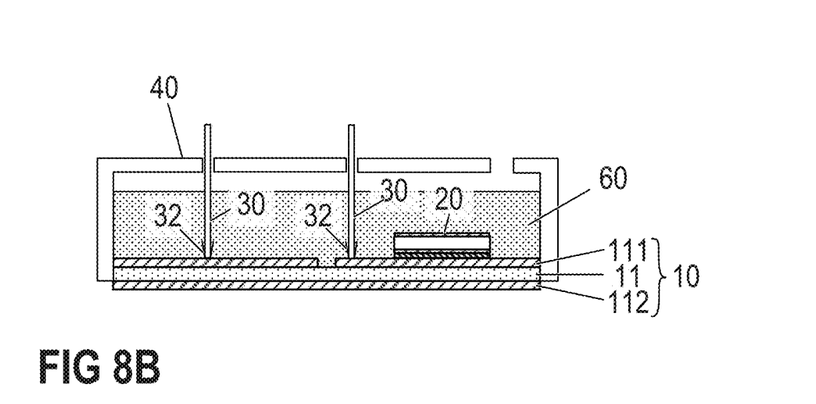
Figure 8C:
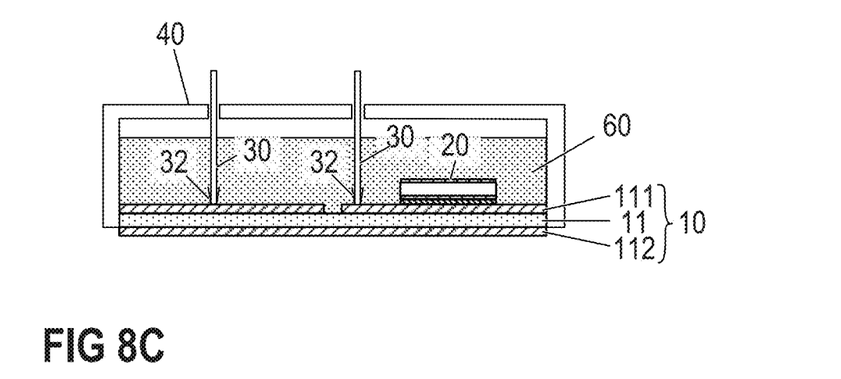

Referring to FIGS. 8A to 8C, a further example of a method for producing a power semiconductor module arrangement is described. Referring to FIG. 8A, the housing 40 comprises walls and a cover and the cover comprises at least one further opening through which the encapsulation material 62 is inserted into the housing 40. No contact element 30 protrudes through this further opening. The substrate 10 with the semiconductor arrangement arranged thereon may be arranged within the housing 40. The encapsulation material 62 may be filled into the capacity formed by the housing 40 and the substrate 10. The encapsulation material 62 may have a liquid, viscous or gel-like consistency. After filling the encapsulation material 62 into the housing 40, a hardening process may follow (FIG. 8B). During this hardening process, some or all of the liquid may be removed from the encapsulation material 62. Thereby, the encapsulation material 62 is hardened and forms the hard encapsulation 60. In a following step, which is schematically illustrated in FIG. 8C, the opening in the housing 40 may be closed. The housing 40 may comprise openings, as has been described above, through which the contact elements 30 protrude.

FIGS. 7A-7C and 8A-8C illustrate exemplary methods for forming a hard encapsulation 60 with an even surface. To form a hard encapsulation 60 with an uneven surface, as has been explained with reference to FIG. 6B above, internal frames (not illustrated) may be arranged on the substrate 10 before filling in the encapsulation material 62 (honeycomb principle). For example, internal frames may be arranged at a first distance around each contact element 30, wherein the first distance equals the radius r of the area having the first thickness x2. In this way, different sections may be formed and encapsulation material 62 may be filled in each of the different sections with different heights x2, x3. Another possibility for forming a hard encapsulation 60 with different heights x2, x3 in different areas is to insert displacement bodies (not illustrated) before filling in the encapsulation material 62. A hard encapsulation 60 having different heights x2, x3, however, may be formed in any other suitable way.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A power semiconductor module arrangement, comprising:
    a housing comprising sidewalls and a cover;
    a substrate arranged in the housing, the substrate comprising a dielectric insulation layer, a first metallization layer arranged on a first side of the dielectric insulation layer, and a second metallization layer arranged on a second side of the dielectric insulation layer, the dielectric insulation layer being disposed between the first and the second metallization layers;
    at least one semiconductor body mounted on a first surface of the first metallization layer which faces away from the dielectric insulation layer;
    a connecting element arranged on and electrically connected to the first surface of the first metallization layer;
    a contact element inserted into and electrically connected to the connecting element, the contact element extending from the connecting element through the interior of the housing and through an opening in the cover of the housing to an outside of the housing in a direction perpendicular to the first surface; and
    a hard encapsulation arranged adjacent to the first metallization layer, the hard encapsulation at least partly filling an inside of the housing.

2. The power semiconductor module arrangement of claim 1, wherein the hard encapsulation has a hardness of at least 40 Shore A.

3. The power semiconductor module arrangement of claim 1, wherein the hard encapsulation has a hardness of at least 60 Shore A.

4. The power semiconductor module arrangement of claim 1, wherein the hard encapsulation has a hardness of at least 50 Shore D.

5. The power semiconductor module arrangement of claim 1, wherein the hard encapsulation comprises a rubber, a polyurethane and/or a plastic.

6. The power semiconductor module arrangement of claim 1, wherein the contact element has a first length between the substrate and the cover of the housing in a direction perpendicular to the first surface of the first metallization layer, wherein the hard encapsulation has a first thickness in a direction perpendicular to the first surface of the first metallization layer, and wherein the first thickness of the hard encapsulation is between 20% and 80% of the first length of the contact element or between 40% and 60% of the first length of the contact element.

7. The power semiconductor module arrangement of claim 6, wherein the first thickness of the hard encapsulation is between 40% and 60% of the first length of the contact element.

8. The power semiconductor module arrangement of claim 1, wherein the contact element has a first length between the substrate and the cover of the housing in a direction perpendicular to the first surface of the first metallization layer, wherein the hard encapsulation has a first thickness in a direction perpendicular to the first surface of the first metallization layer in areas within a radius around the contact element, wherein the hard encapsulation has a second thickness in a direction perpendicular to the first surface of the first metallization layer in areas outside the radius around the contact element, and wherein the first thickness is greater than the second thickness.

9. The power semiconductor module arrangement of claim 8, wherein the first thickness of the hard encapsulation is between 20% and 80% of the first length of the contact element, and wherein the second thickness of the hard encapsulation is between 10% and 60% of the first length of the contact element.

10. The power semiconductor module arrangement of claim 1, wherein the hard encapsulation is configured to provide a barrier for corrosive gases.

11. The power semiconductor module arrangement of claim 10, wherein the hard encapsulation has an oxygen transmission coefficient of less than $10^{-10}$.

12. The power semiconductor module arrangement of claim 11, wherein the oxygen transmission coefficient of the hard encapsulation is less than $10^{-12}$.

13. The power semiconductor module of claim 1, wherein the hard encapsulation comprises a filler that is evenly distributed in the hard encapsulation.

14. The power semiconductor module arrangement of claim 13, wherein the filler comprises $Al_2O_3$, $SiO_2$, and/or inert porous plastic bodies.

15. The power semiconductor module arrangement of claim 1, wherein the connecting element comprises a tubular part configured to fit over and encompass a first end of the contact element.

16. The power semiconductor module arrangement of claim 15, wherein the contact element comprises, at the first end, a press-fit pin, wherein the connecting element comprises a counterpart for the press-fit pin of the contact element, and wherein the first end of the contact element and the connecting element form a press-fit connection when the contact element is inserted into the connecting element.

* * * * *

UNITED STATES PATENT AND TRADEMARK OFFICE
CERTIFICATE OF CORRECTION

PATENT NO. : 11,081,414 B2  
APPLICATION NO. : 16/260834  
DATED : August 3, 2021  
INVENTOR(S) : A. Roth et al.

Page 1 of 1

It is certified that error appears in the above-identified patent and that said Letters Patent is hereby corrected as shown below:

On the Title Page

Item (56)/other publications (Line 2), please change "Coming" to -- Corning --.

Signed and Sealed this  
Nineteenth Day of October, 2021

Drew Hirshfeld  
*Performing the Functions and Duties of the*  
*Under Secretary of Commerce for Intellectual Property and*  
*Director of the United States Patent and Trademark Office*